(12) United States Patent
Ooki

(10) Patent No.: US 12,108,171 B2
(45) Date of Patent: Oct. 1, 2024

(54) SOLID STATE IMAGING UNIT AND SOLID STATE IMAGING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masayuki Ooki, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 289 days.

(21) Appl. No.: 17/684,159

(22) Filed: Mar. 1, 2022

(65) Prior Publication Data

US 2023/0077483 A1 Mar. 16, 2023

(30) Foreign Application Priority Data

Sep. 14, 2021 (JP) ................. 2021-149630

(51) Int. Cl.
*H04N 25/40* (2023.01)
*H04N 25/75* (2023.01)
*H04N 25/772* (2023.01)

(52) U.S. Cl.
CPC ............. *H04N 25/40* (2023.01); *H04N 25/75* (2023.01); *H04N 25/772* (2023.01)

(58) Field of Classification Search
None
See application file for complete search history.

(56) References Cited

U.S. PATENT DOCUMENTS

| 7,091,464 | B2 | 8/2006 | Murayama et al. |
| 7,675,560 | B2 | 3/2010 | Iwamoto et al. |
| 2005/0189492 | A1* | 9/2005 | Milton ............... H04N 5/33 |
| | | | 257/E27.131 |
| 2010/0321616 | A1 | 12/2010 | Ha |
| 2011/0101205 | A1* | 5/2011 | Tian ................ H04N 25/75 |
| | | | 250/208.1 |
| 2016/0013228 | A1* | 1/2016 | Fukui .............. H01L 27/14612 |
| | | | 257/225 |

(Continued)

FOREIGN PATENT DOCUMENTS

| JP | H04369268 A | 12/1992 |
| JP | H08163314 A | 6/1996 |

(Continued)

OTHER PUBLICATIONS

Japanese Office Action dated Mar. 15, 2024, mailed in counterpart Japanese Application No. 2021-149630, 9 pages (with translation).

*Primary Examiner* — Mark T Monk
(74) *Attorney, Agent, or Firm* — Kim & Stewart LLP

(57) ABSTRACT

According to one embodiment, a solid-state imaging unit includes a plurality of pixels arranged along a first direction. The pixels each include a photoelectric conversion unit and a filter on the photoelectric conversion unit. The filer has a planar shape corresponding to a planar shape of the photoelectric conversion unit. The filter has a width in the first direction is different from a width of the filter in a second direction orthogonal to the first direction.

20 Claims, 11 Drawing Sheets

(56) References Cited

U.S. PATENT DOCUMENTS

2019/0157329 A1     5/2019  Kim
2020/0358959 A1*   11/2020  Kita ..................... H04N 23/651
2021/0104561 A1*    4/2021  Durko ................ H01L 27/1461

FOREIGN PATENT DOCUMENTS

| JP | H08251347 A | 9/1996 |
| JP | 2003318386 A | 11/2003 |
| JP | 2011004318 A | 1/2011 |
| JP | 4858281 B2 | 1/2012 |
| JP | 2013258168 A | 12/2013 |

* cited by examiner

SOLID STATE IMAGING UNIT AND SOLID STATE IMAGING DEVICE

CROSS-REFERENCE TO RELATED APPLICATION(S)

This application is based upon and claims the benefit of priority from Japanese Patent Application No. 2021-149630, filed Sep. 14, 2021, the entire contents of which are incorporated herein by reference.

FIELD

Embodiments described herein relate generally to solid-state imaging units and solid-state imaging devices.

BACKGROUND

Certain solid-state imaging devices include a pixel array with photoelectric conversion units, such as photodiodes, for each of the pixels. These solid-state imaging devices generate an image based on pixel signals acquired by each of the photoelectric conversion units.

Each column within the pixel array can sequentially read the same position within an original image during a mechanical scanning operation. However, due to errors in the mechanical scanning operation, the pixel columns typical read the original image at somewhat different positions. In such a case, an unintended color shift may occur in a reproduced image of the original image.

DETAILED DESCRIPTION

Embodiments provide a solid-state imaging unit and a solid-state imaging device capable of preventing a color shift.

In general, according to one embodiment, a solid-state imaging unit includes a plurality of pixels arranged along a first direction. The pixels each include a photoelectric conversion unit and a filter on the photoelectric conversion unit. The filer has a planar shape corresponding to a planar shape of the photoelectric conversion unit. The filter has a width in the first direction is different from a width of the filter in a second direction orthogonal to the first direction.

Hereinafter, certain example embodiments of the present disclosure will be described with reference to the drawings. In the examples, a characteristic configuration and an operation of a solid-state imaging device will be mainly described. It is noted that certain aspects of configuration and operation of the solid-state images may be omitted in the following description.

Embodiment

Figure 1:
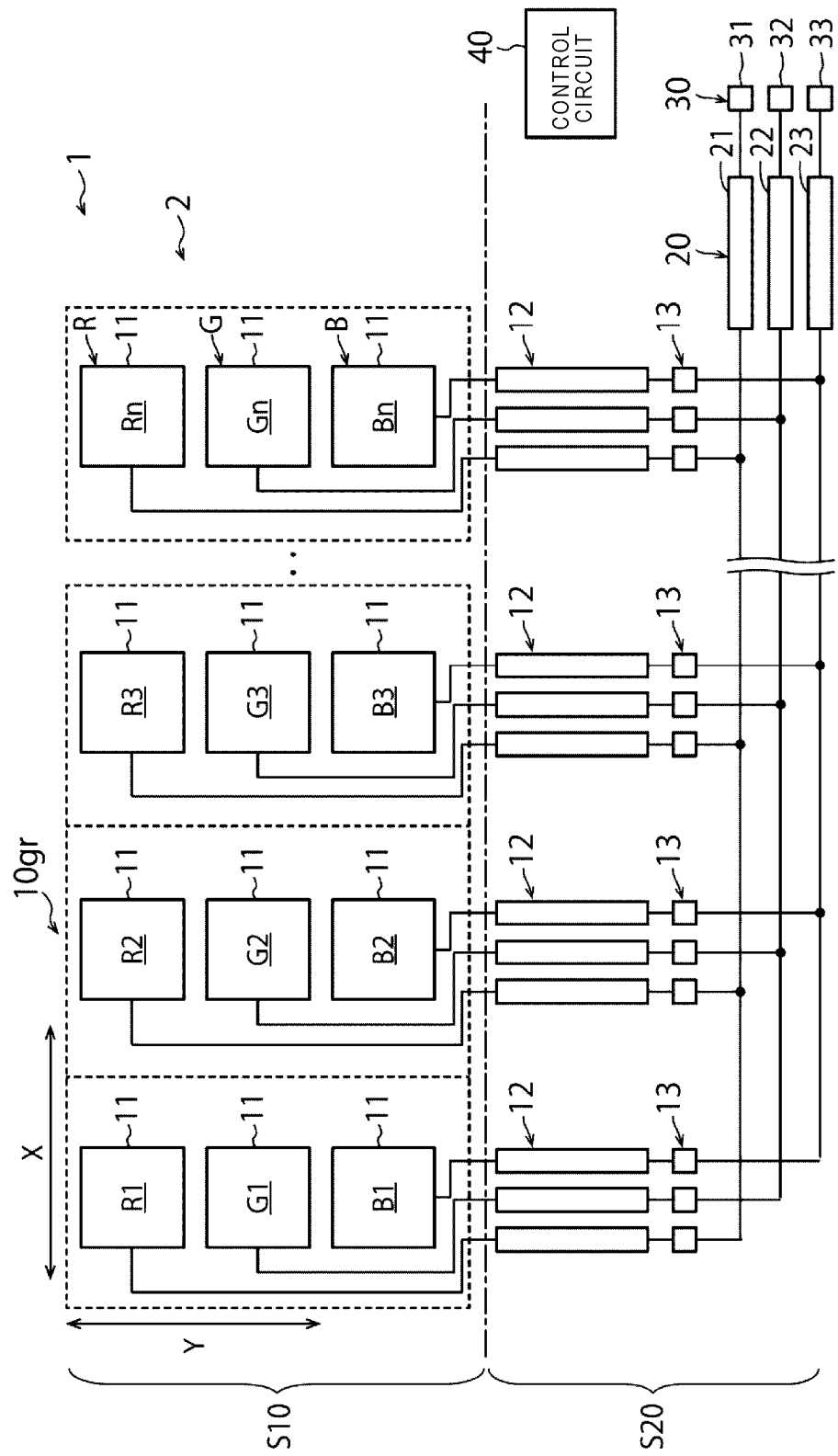
FIG. 1 is a block diagram showing an example of a schematic configuration of a solid-state imaging device.
Figure 2:
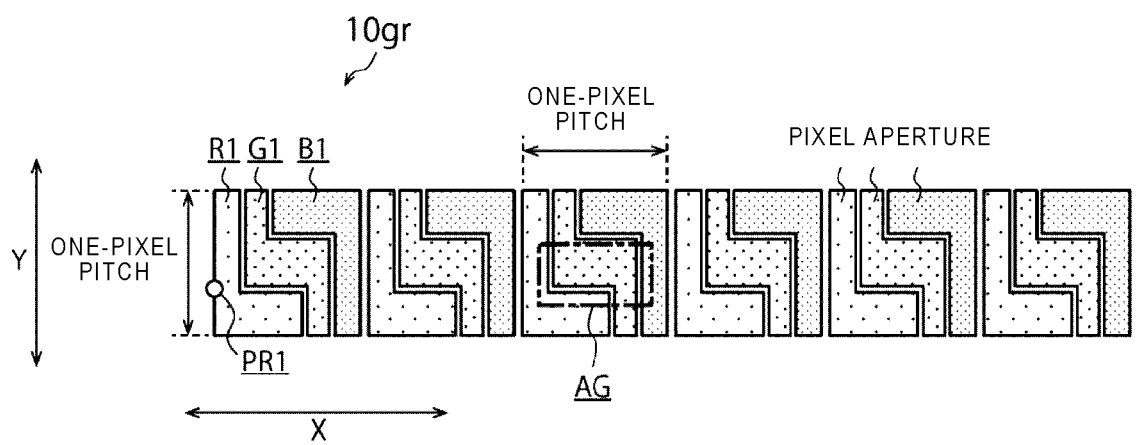
FIG. 2 is a diagram showing an arrangement example of a pixel group.
Figure 3:
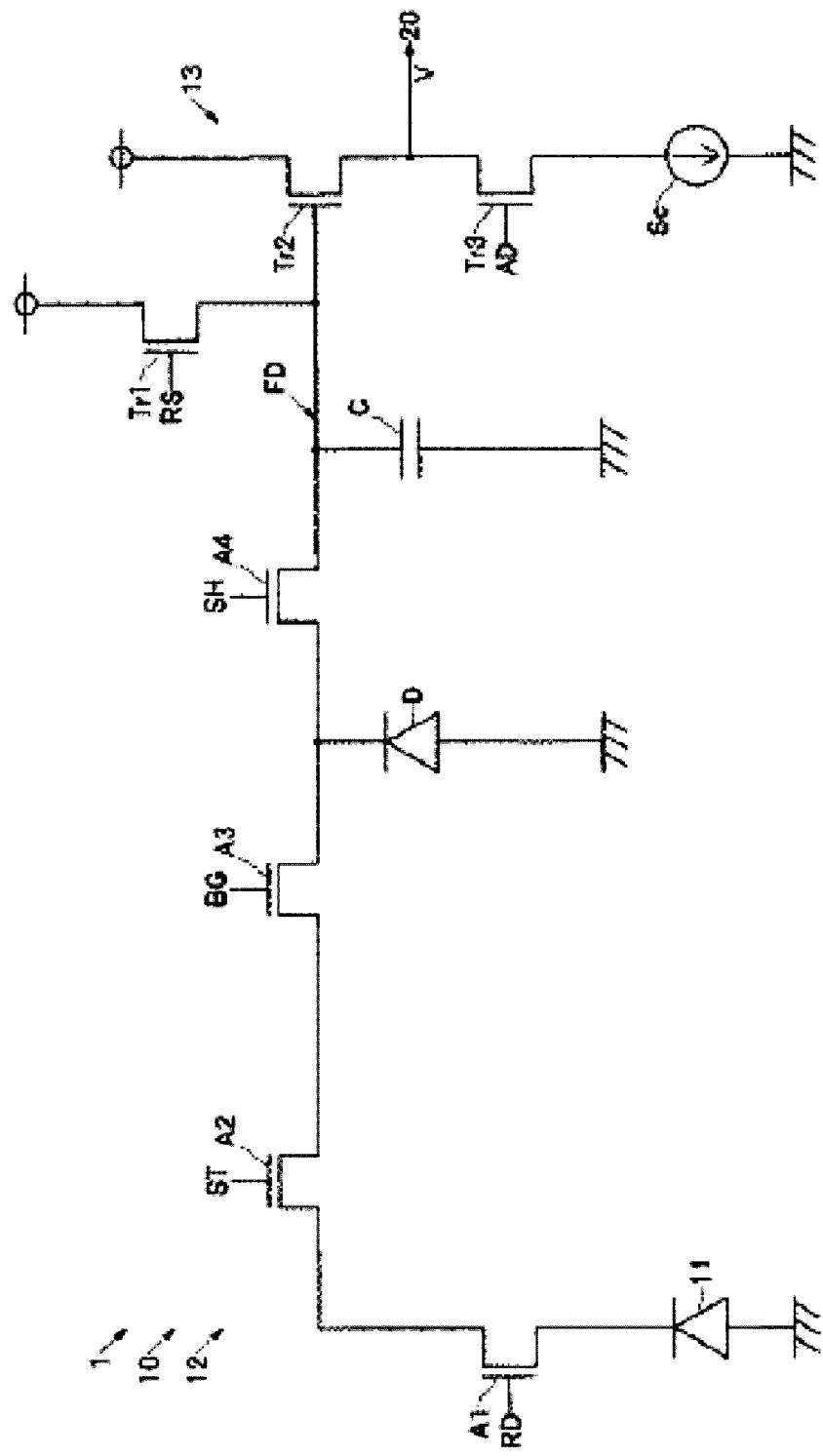
FIG. 3 is a diagram showing a circuit configuration example of a pixel.

A configuration example of a solid-state imaging device 1 will be described with reference to FIGS. 1 to 3. FIG. 1 is a block diagram showing an example of a schematic configuration of the solid-state imaging device 1. FIG. 2 is a diagram showing an arrangement example of a pixel group 10gr of the solid-state imaging device 1. FIG. 3 is a diagram showing a circuit configuration example of a pixel 10. In this example, the solid-state imaging device 1 is a linear imaging unit in which pixels are linearly arranged with one another. The solid-state imaging device 1 is a device that acquires image information from a reading target by relative movement of the solid-state imaging device 1 and the reading target.

As shown in FIG. 1, the solid-state imaging device 1 includes a solid-state imaging unit 2 and a control circuit 40. The solid-state imaging unit 2 includes a plurality of pixel groups 10gr, an output circuit 20, and an output terminal 30. Each of pixels R1 to Rn, G1 to Gn, and B1 to Bn forming the plurality of pixel groups 10gr outputs a pixel signal V to the output terminal 30 via the output circuit 20. Each of the pixels R1 to Rn, G1 to Gn, and B1 to Bn is controlled by the control circuit 40. Each of the pixels R1 to Rn, G1 to Gn, and B1 to Bn includes a photoelectric conversion unit 11 (also referred to as a light receiving element 11), a color filter R or G or B corresponding to each light receiving element 11, a charge transfer circuit 12, and a charge voltage conversion circuit 13. A photoelectric conversion layer S10 and a control element layer S20 are, for example, a stacked structure. That is, the photoelectric conversion layer S10 is stacked upon the control element layer S20. The color filters R, G, and B corresponding to the light receiving elements 11 are in the photoelectric conversion layer S10, and the charge transfer circuit 12, the charge voltage conversion circuit 13, and the output circuit 20 are in the control element layer S20. With such a configuration, an aperture ratio of each of the pixels R1 to Rn, G1 to Gn, and B1 to Bn can be increased as compared with a case where the charge transfer circuit 12, the charge voltage conversion circuit 13, and the output circuit 20 are in the same layer as the color filters R, G, B.

As shown in FIG. 2, the pixel group 10gr includes a red pixel R1, a green pixel G1, and a blue pixel B1. The red pixel R1 includes a filter (referred to as a "red filter R") that transmits red light. The green pixel G1 includes a filter (referred to as a "green filter G") that transmits green light. The blue pixel B1 includes a filter (referred to as a "blue filter B") that transmits blue light. More specifically, a partition wall that reduces color mixing is provided at a boundary of photoelectric conversion elements forming the red pixel R1, the green pixel G1, and the blue pixel B1. The red filter R, the green filter G, and the blue filter B are respectively disposed in pixel apertures of the photoelectric conversion elements of the photoelectric conversion layer S10. Here, a one-pixel pitch corresponds to a resolution of each pixel. That is, in the present embodiment, the red pixel R1, the green pixel G1, and the blue pixel B1 are arranged together within a one-pixel pitch in a main scanning direction X (first direction) and a one-pixel pitch in a sub-scanning direction Y (second direction). Color filters according to the present embodiment are R, G, and B, but are not limited thereto. For example, cyan, magenta, yellow, green filters may be used in combination.

The red pixel R1, the green pixel G1, and the blue pixel B1 are arranged by dividing the vertical one-pixel pitch distance and the horizontal one-pixel pitch distance into three parts. Each of the red filter R, the green filter G, and the blue filter B has a shape such that a width in the main scanning direction X is different from that of the sub-scanning direction Y. For example, when a width of the red filter R in the main scanning direction X gradually increases with respect to the sub-scanning direction Y, a width of the blue filter B in the main scanning direction X gradually decreases with respect to the sub-scanning direction Y. That is, the red filter R has a constant width up to a predetermined point PR1 in the sub-scanning direction Y, and is wider than the constant width when the predetermined point PR1 is exceeded. A total value of the widths of the red filter R, the green filter G, and the blue filter B in the main scanning direction X is the value of a one-pixel pitch width (distance) corresponding to the resolution in the main scanning direction X.

More specifically, the green pixel G1 is sandwiched between an L-shaped red pixel R1 and an L-shaped blue pixel B1 (rotated by 180 degrees from the red pixel R1). The shape of the red pixel R1, the shape of the green pixel G1, and the shape of the blue pixel B1 are different from one another. Pixel apertures for the pixels of all the colors in the main scanning direction X are wide, for example, has a spread of two-thirds of the one-pixel pitch, and more information on a color distribution in the main scanning direction X can be obtained. The pixel apertures in the vertical sub-scanning direction Y also have a width corresponding to the one-pixel pitch distance, and pixel sensitivity is higher. The green pixel G1 is provided at a center (midpoint) of the vertical one-pixel pitch distance and the horizontal one-pixel pitch distance. That is, a main region AG of the green pixel G1 is disposed at a center of the pixel group 10gr. Accordingly, since the aperture of the green pixel G1 is widely provided about the center of the pixel pitch, even if a mechanical shift occurs in the main scanning direction X or the sub-scanning direction Y during reading, a contour of an image within the vertical one-pixel pitch and the horizontal one-pixel pitch can be easily obtained.

Each of the pixel groups 10gr includes the red pixel R1, the green pixel G1, and the blue pixel B1, and the pixel groups 10gr are arranged in a one-dimensional row in the main scanning direction X. Thus, in the present embodiment, the first color pixels R1 to Rn, which are red pixels, the second color pixels G1 to Gn, which are green pixels, and the third color pixels B1 to Bn, which are blue pixels, are arranged alternately in order along the main scanning direction X. In the present embodiment, when all or a part of the first color pixels R1 to Rn are shown, they are referred to as first color pixels R, when all or a part of the second color pixels G1 to Gn are shown, they are referred to as second color pixels G, and when all or a part of the third color pixels B1 to Bn are shown are, they referred to as third color pixels B. All or a part of the first color pixels R1 to Rn, the second color pixels G1 to Gn, and the third color pixels B1 to Bn are referred to as pixels 10.

As shown in FIG. 3, for the light receiving element 11, an anode is connected to a ground voltage and a cathode is connected to the charge transfer circuit 12. When the light receiving element 11 is exposed to light (photons), the light receiving element 11 photoelectrically converts incident light and accumulates a signal charge. The light receiving element 11 may be, for example, a photodiode capable of photoelectric conversion.

The charge transfer circuit 12 then reads and transfers the signal charge from the light receiving element 11 to the charge voltage conversion circuit 13. The charge transfer circuit 12 includes a read gate A1, an accumulation gate A2, a barrier gate A3, an accumulation diode D, and a transfer gate A4. The read gate A1, the accumulation gate A2, the barrier gate A3, and the transfer gate A4 are connected in order in series.

The read gate A1 transfers the signal charge accumulated in the light receiving element 11 to the accumulation gate A2 in response to a read signal RD being input from the control circuit 40. The accumulation gate A2 receives the accumulation signal ST from the control circuit 40, has an accumulation charge amount corresponding to the accumulation signal ST, and accumulates the signal charge transferred from the read gate A1.

The barrier gate A3 transfers the signal charge accumulated in the accumulation gate A2 to the accumulation diode D in response to a barrier signal BG being input from the control circuit 40. In the accumulation diode D, the cathode is connected to an output end of the barrier gate A3 and an input end of the transfer gate A4, and the anode is connected to the ground voltage. The accumulation diode D accumulates the signal charge transferred from the barrier gate A3. The transfer gate A4 transfers the signal charge accumulated in the accumulation diode D to the charge voltage conversion circuit 13 in response to a transfer signal SH being input from the control circuit 40.

The charge voltage conversion circuit 13 converts the signal charge transferred from the charge transfer circuit 12 into a signal voltage and outputs a pixel signal V to the output circuit 20. The charge voltage conversion circuit 13 includes a floating diffusion FD element, a reset transistor Tr1, an amplifier transistor Tr2, an address transistor Tr3, and a constant current source Sc. Each of the reset transistor Tr1, the amplifier transistor Tr2, and the address transistor Tr3 is implemented by an n-type transistor, but may be implemented by a p-type transistor in other examples.

The floating diffusion FD element has a capacitor C. One end of the capacitor C is connected to the transfer gate A4 and a gate of the amplifier transistor Tr2, and the other end is connected to the ground voltage. The capacitor C converts the signal charge transferred from the transfer gate A4 into the signal voltage. One end of the reset transistor Tr1 is connected to a reference voltage, and the other end is connected to the floating diffusion FD. The reset transistor Tr1 connects the floating diffusion FD to the reference voltage in response to a reset signal RS being input from the control circuit 40, and discharges the signal charge.

One end of the amplifier transistor Tr2 is connected to a power supply voltage, and the other end is connected to the address transistor Tr3 and the output circuit 20. When the amplifier transistor Tr2 is connected to the constant current source Sc, the amplifier transistor Tr2 performs a source follower operation, and outputs a pixel signal V to the output circuit 20. The pixel signal V corresponds to the signal voltage of the floating diffusion FD input to the gate of the amplifier transistor Tr2.

The address transistor Tr3 is provided between the amplifier transistor Tr2 and the constant current source Sc. A gate of the address transistor Tr3 is connected to the control circuit 40. The constant current source Sc and the amplifier transistor Tr2 are connected or cut off from one another in response to an address signal AD being input from the control circuit 40. The constant current source Sc is provided between the amplifier transistor Tr2 and the ground voltage.

Also, as shown in FIG. 1, the output circuit 20 includes an output circuit 21 connected to the first color pixel R, an output circuit 22 connected to the second color pixel G, and an output circuit 23 connected to the third color pixel B. The output circuit 20 performs predetermined signal processing such as amplification on the pixel signals V received from the pixels R1 to Rn, G1 to Gn, and B1 to Bn, and outputs the pixel signals V to the output terminal 30. The output terminal 30 includes an output terminal 31 that is connected to the output circuit 21 and outputs a pixel signal Vr corresponding to each of the pixels R1 to Rn, an output terminal 32 that is connected to the output circuit 22 and outputs a pixel signal Vg corresponding to each of the pixels G1 to Gn, and an output terminal 33 that is connected to the output circuit 23 and outputs a pixel signal Vb corresponding to each of the pixels B1 to Bn. For example, the RGB array data when the pixel signals Vr, Vg, and Vb are AD-converted (analog-to-digital conversion) into image data are respectively associated with the same coordinate data for each pixel group 10gr. For example, the same coordinates (x, y), such as Vr (x, y), Vg (x, y), Vb (x, y), are assigned to data from the same pixel group 10gr. As for the coordinates (x, y), a different coordinate (x) value is assigned to each one-pixel pitch distance along the main scanning direction, and a different coordinate (y) value is assigned to each one-pixel pitch distance in the sub-scanning direction.

The control circuit 40 includes, for example, a shift register. The control circuit 40 outputs a read signal RD and gives an instruction to read the signal charge accumulated in the light receiving element 11. More specifically, the control circuit 40 outputs the read signal RD according to an exposure cycle of each pixel group 10gr. When the read signal RD is in an OFF state, the read gate A1 is cut off and the signal charge is accumulated in the light receiving element 11. When the read signal RD is in an ON state, the read gate A1 is connected, and the signal charge is read from the light receiving element 11 to the accumulation gate A2.

The control circuit 40 outputs an accumulation signal ST having a predetermined voltage to the accumulation gate A2. This control circuit 40 outputs the barrier signal BG, and gives an instruction to transfer the signal charge of the accumulation gate A2 of each pixel group 10gr before start of a signal output cycle. For example, the control circuit 40 may output the barrier signal BG to all the pixels R1 to Rn, G1 to Gn, and B1 to Bn at the same time before the start of a signal output cycle. When the barrier signal BG is in an ON state, the signal charge is read from the accumulation gate A2 to the accumulation diode D. When the barrier signal BG is in an OFF state, the accumulation diode D is cut off from the accumulation gate A2.

The control circuit 40 sequentially outputs a transfer signal SH corresponding to the positions of the pixel group 10gr along the main scanning direction X in the signal output cycle, and gives an instruction to transfer the signal charge from the different pixel groups 10gr in turn. When the transfer signal SH is in an ON state, the signal charge is transferred from the accumulation diode D to the floating diffusion FD. When the transfer signal SH is in an OFF state, the floating diffusion FD is cut off from the accumulation diode D.

The control circuit 40 outputs the address signal AD and also gives an instruction to output the pixel signal V. When the address signal AD is in an ON state, the amplifier transistor Tr2 is connected to the constant current source Sc, and the pixel signal V corresponding to the signal voltage of the floating diffusion FD is output to the output circuit 20. After outputting each pixel signal V of the pixels 10, the control circuit 40 turns off the address signal AD and cuts off the constant current source Sc from the amplifier transistor Tr2.

The control circuit 40 outputs the reset signal RS after outputting each of the pixel signals V, and gives an instruction to reset the signal charge. When the reset signal RS is in an ON state, the reference voltage is connected to the floating diffusion FD, and the floating diffusion FD is reset. That is, the accumulation gate A2 forms a pre-stage accumulation unit. The accumulation diode D forms a post-stage accumulation unit.

Operation

Figure 4:
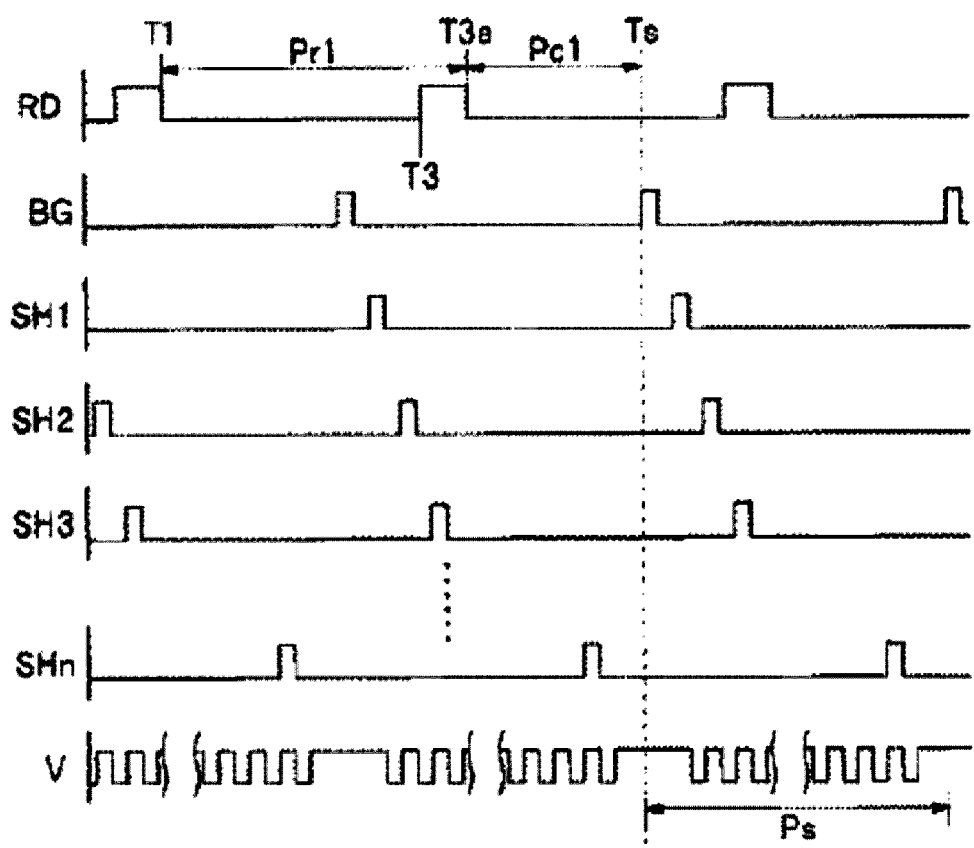
FIG. 4 is a waveform diagram for a solid-state imaging device.

Next, an operation of the solid-state imaging device 1 will be described. FIG. 4 is a diagram showing an example of a waveform diagram of the read signal RD, the barrier signal BG, the transfer signal SH, and the pixel signal V of the solid-state imaging device 1 according to the embodiment.

When the control circuit 40 outputs a read signal RD in an OFF state at a time T1, the light receiving element 11 and the charge transfer circuit 12 are cut off, and the light receiving element 11 of each of the pixels R1 to Rn, G1 to Gn, and B1 to Bn starts accumulating the signal charge by exposure. The period from to time T1 to a time T3a is an exposure cycle Pr1.

When the control circuit 40 outputs a read signal RD in an ON state at a time T3, the read gate A1 for each of the pixels R1 to Rn, G1 to Gn, and B1 to Bn reads the signal charge from the light receiving element 11 to the accumulation gate A2 until the read signal RD in the OFF state is output at the time T3a. The accumulation gate A2 of the first color pixel R accumulates the signal charge during an accumulation cycle Pc1 from the time T3a to a time Ts.

At the time Ts, a signal output cycle Ps starts. When the control circuit 40 outputs the barrier signal BG in the ON state at the time Ts, the barrier gate A3 for each of the pixels R1 to Rn, G1 to Gn, and B1 to Bn transfers the signal charge from the accumulation gate A2 to the accumulation diode D.

Subsequently, when the control circuit 40 outputs transfer signals SH1 to SHn in an ON state, the transfer gate A4 for each of the pixel groups 10gr arranged along the main scanning direction X sequentially transfers the signal charge from the accumulation diode D to the floating diffusion FD.

The amplifier transistor Tr2 for each of the pixel groups 10gr arranged along the main scanning direction X sequentially outputs the pixel signal V corresponding to the signal voltage of the floating diffusion FD when the control circuit 40 outputs the address signal AD in the ON state.

More specifically, the first color pixel R outputs the pixel signal Vr corresponding to a signal charge accumulated in the exposure cycle Pr1 to the output circuit 21. The second color pixel G outputs the pixel signal Vg corresponding to a signal charge accumulated in the exposure cycle Pr1 to the output circuit 22. The third color pixel B also outputs the pixel signal Vb corresponding to a charge accumulated in the exposure cycle Pr1 to the output circuit 23. Thus, each pixel in a pixel group 10gr outputs the pixel signals Vr, Vg, and Vb at the same time. Then, the output circuit 20 amplifies the pixel signals and outputs the pixel signal V to the output terminal 30.

Comparison with Comparative Example

Figure 5A:
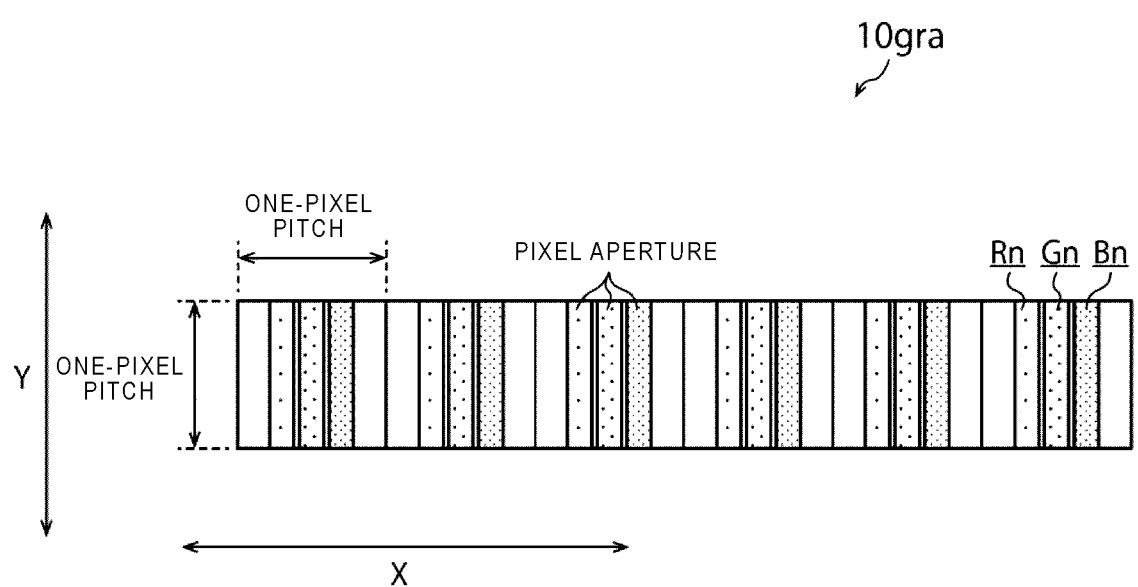
FIG. 5A is diagram showing a pixel arrangement example according to a first comparative example.

FIG. 5A is a diagram showing a pixel arrangement example according to a first comparative example. In the first comparative example, the red pixel Rn, the green pixel Gn, and the blue pixel Bn having the same shape are arranged in a pixel group 10gra within the one-pixel pitch in the main scanning direction X and the one-pixel pitch in the sub-scanning direction Y. In the example, the red pixel Rn, the green pixel Gn, and the blue pixel Bn which have a rectangular shape are arranged in parallel in the main scanning direction X.

Figure 5B:
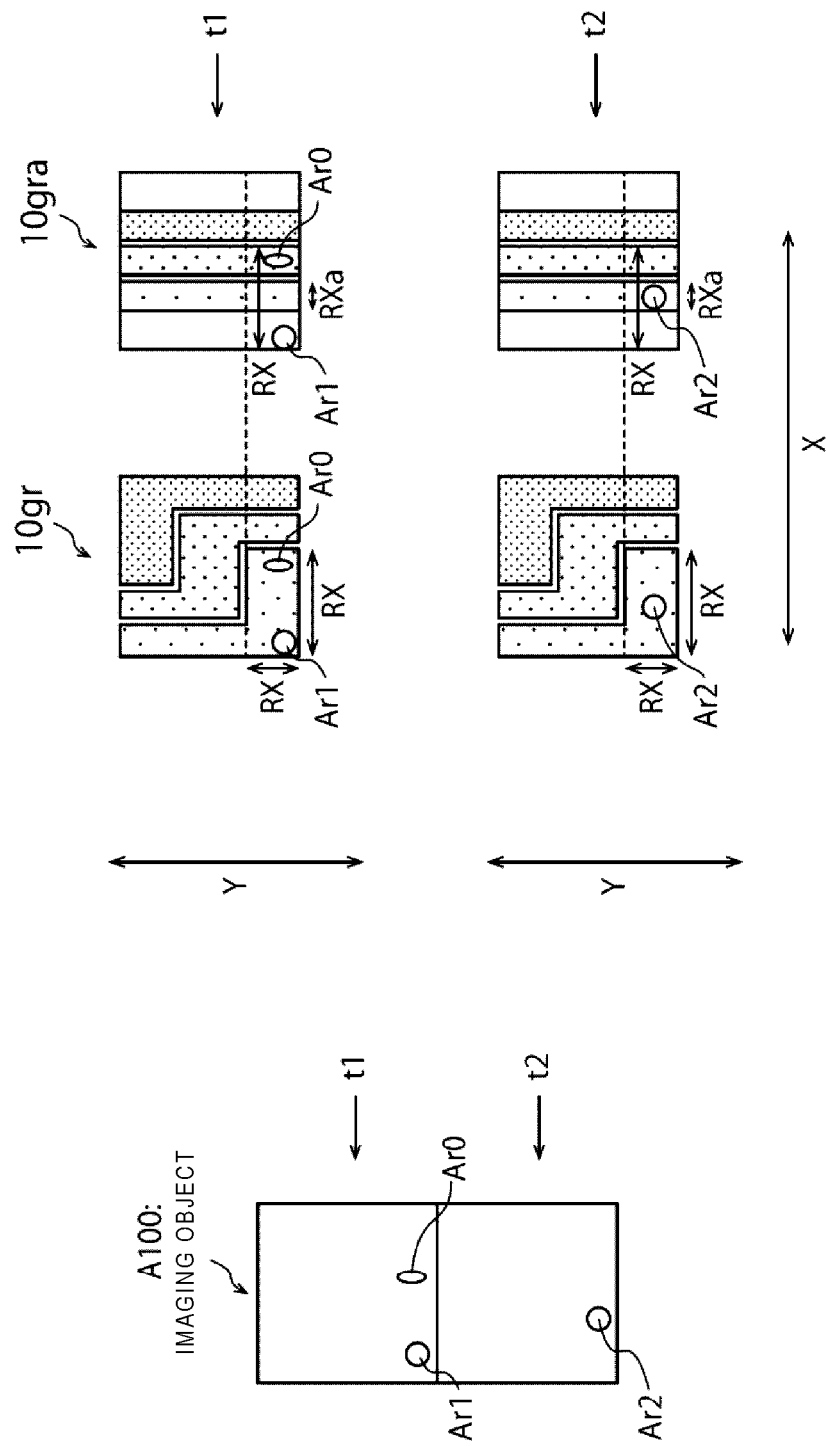
FIG. 5B is a diagram in which pixel groups are arranged at a one-pixel pitch.

FIG. 5B is a diagram in which the pixel group 10gr according to the present embodiment and the pixel group 10gra according to the first comparative example are arranged at the one-pixel pitch. FIG. 5B shows a case where an imaging object A100 has red regions Ar0, Ar1 and Ar2 on a white background. The rectangles have sides that match the corresponding one-pixel pitch distance. A width RX of the red pixel in the main scanning direction X according to the present embodiment is wider than one half of the one-pixel pitch distance, for example. On the other hand, a width RXa of the red pixel in the main scanning direction X according to the first comparative example is less than one sixth (⅙) of the one-pixel pitch distance.

Therefore, as shown in FIG. 5B, when imaging is performed at time t1 and t2 by the solid-state imaging unit 2 which is shifted by the one-pixel pitch between the time t1 and t2 in the sub-scanning direction Y, the red pixel according to the present embodiment can acquire red information of the red regions Ar0 and Ar1 in the imaging at the time t1, but it is difficult to acquire the red information in the first comparative example. In the imaging at the time t2, the red pixels according to both the present embodiment and according to the first comparative example can acquire the red information in the red region Ar2. Since the red pixel according to the present embodiment can acquire color information of the red regions Ar0, Ar1 and Ar2, image signals generated at the times t1 and t2 have the red information. On the other hand, the red pixel according to the first comparative example cannot acquire the red information at the time t1, outputs an image signal corresponding to a white background, and thus causes a color shift. In the red pixel according to the first comparative example, since the red information can be acquired at the time t2, a red tone may be uneven at the time t1 and the time t2.

The same applies similarly to the blue pixels and the green pixels. In other words, pixels of each color according to the present embodiment are more likely to acquire color information than those according to the first comparative example. As such, the present embodiment is more likely to avoid or reduce a color shift than is the first comparative example when a mechanical shift occurs in the main scanning direction X during reading. In the present embodiment, a shift between an actual color of the imaging object A100 and a color in a reproduced image based on an image signal V output by the solid-state imaging unit 2 is referred to as a color shift.

Figure 6A:
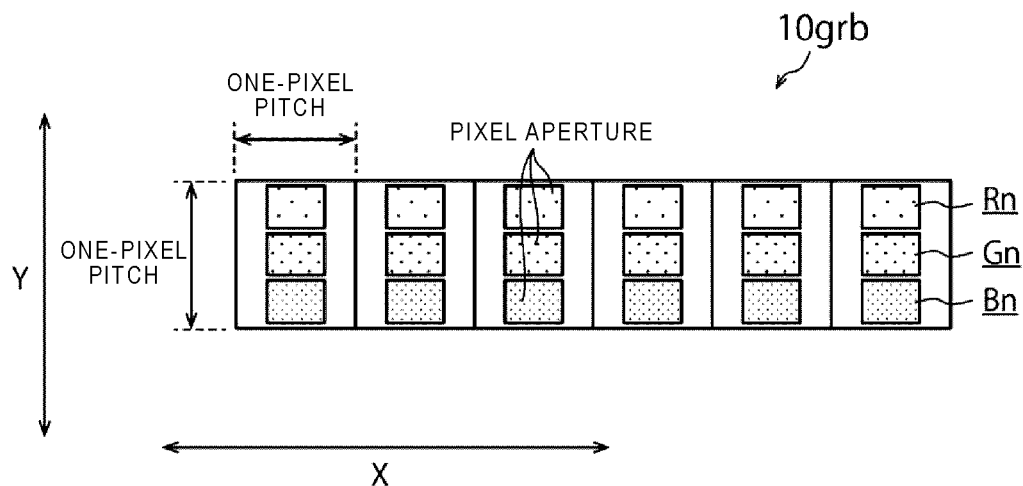
FIG. 6A is a diagram showing a pixel arrangement example according to a second comparative example.

FIG. 6A is a diagram showing a pixel arrangement example according to a second comparative example. In the second comparative example, the red pixel Rn, the green pixel Gn, and the blue pixel Bn having the same shape are arranged in a pixel group 10grb within the one-pixel pitch in the main scanning direction X and the one-pixel pitch in the sub-scanning direction Y. In the example, the red pixel Rn, the green pixel Gn, and the blue pixel Bn which have the rectangular shape are arranged in parallel in the sub-scanning direction Y.

Figure 6B:
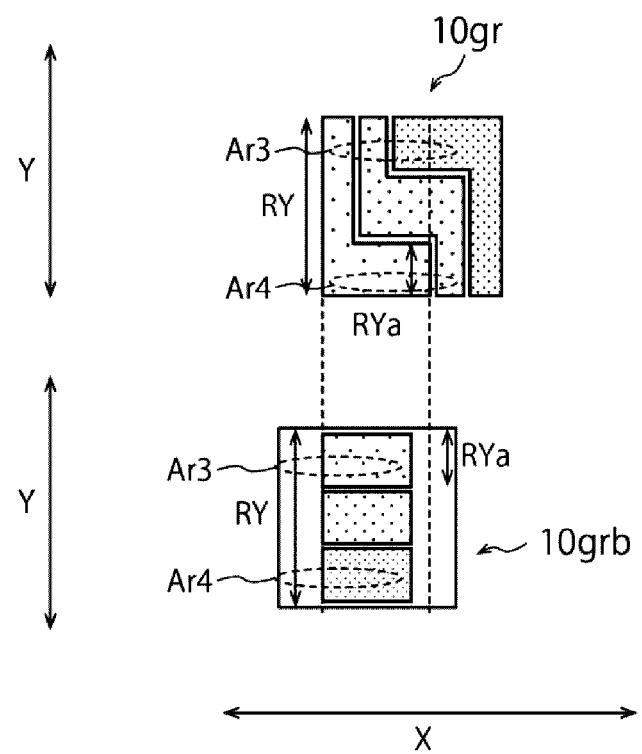
FIG. 6B is a diagram in which the pixel groups are arranged vertically at a one-pixel pitch.

FIG. 6B is a diagram in which the pixel group 10gr according to the present embodiment and the pixel group 10grb according to the second comparative example are arranged at the one-pixel pitch. For example, a width RYa of the red pixel in the sub-scanning direction Y according to the second comparative example is one-third (⅓) of the one-pixel pitch. On the other hand, a width RY in the sub-scanning direction Y according to the present embodiment is the one-pixel pitch.

Therefore, the red pixel according to the present embodiment can acquire red information of red regions Ar3 and Ar4, but it is difficult to acquire the red information of the red region Ar4 in the comparative example. Thus, the red pixel according to the present embodiment is more likely to acquire the red information distributed in the sub-scanning direction Y than is the red pixel of the second comparative example. Accordingly, the color shift is reduced as compared with the second comparative example. The same similarly applies to the blue pixels and the green pixels. In other words, the present embodiment is more likely to acquire color information than is the second comparative example, and thus the present embodiment is more likely to avoid or reduce a color shift than is the second comparative example even when a mechanical shift occurs in the sub-scanning direction Y during reading.

In both first and second comparative examples, a part of the charge transfer circuit 12 and the charge voltage conversion circuit 13 is formed within the photoelectric conversion layer S10, and aperture ratios are thus limited. On the other hand, in the solid-state imaging device 1 according to the present embodiment, the charge transfer circuit 12, the charge voltage conversion circuit 13, and the output circuit 20 are formed only in the control element layer S20. Therefore, the aperture ratios of the red pixel R1, the green pixel G1, and the blue pixel B1 in the vertical one-pixel pitch and the horizontal one-pixel pitch can be made wider than those according to the first and second comparative examples. Therefore, sensitivities of the red pixel R1, the green pixel G1, and the blue pixel B1 according to the present embodiment are higher than those according to the first and second comparative examples.

According to the present embodiment, the solid-state imaging unit 2 includes the filters R, G, and B that have a planar shape corresponding to a shape of the respective photoelectric conversion unit 11 and pass light in a specific wavelength range. The filters R, G, and B have a shape such that the width of the main scanning direction X is different from that of the sub-scanning direction Y orthogonal to the main scanning direction X. Therefore, it is possible to further expand the imaging region in the main scanning direction X and the sub-scanning direction Y of each pixel of a pixel group. Therefore, it is possible to further reduce a color shift of the reproduced image using image signals of the solid-state imaging unit 2.

First Modification

Figure 7:
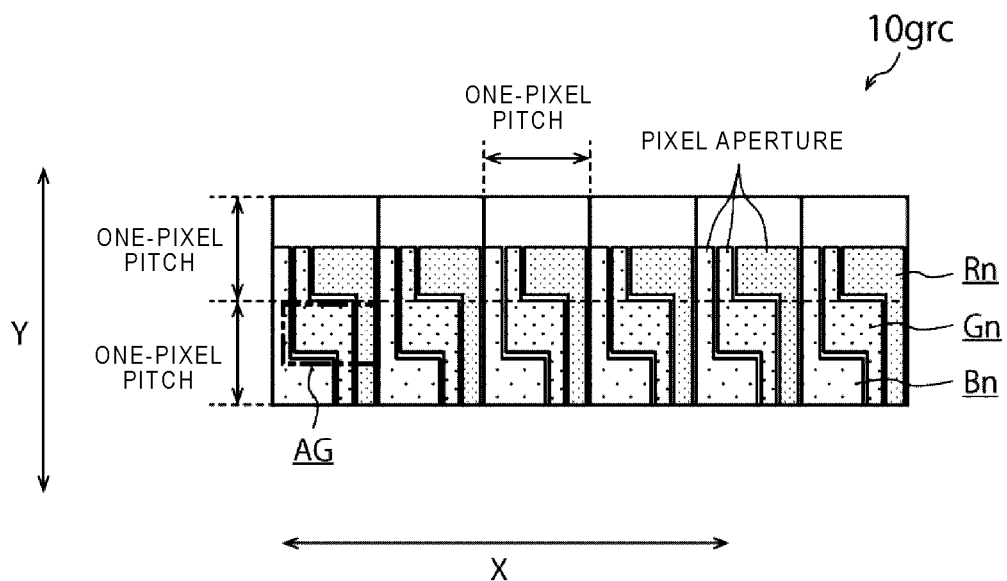
FIG. 7 is a diagram showing a configuration example of a pixel group according to a first modification.

FIG. 7 is a diagram showing a configuration example of the pixel group 10gr according to the first modification. As shown in FIG. 7, the first modification differs from the first embodiment in that sizes of the red pixel Rn, the green pixel Gn, and the blue pixel Bn in the sub-scanning direction Y are set to be larger than the pixel pitch distance (one-pixel pitch) but less than 2 times (2×) the pixel pitch distance. That is, the solid-state imaging device 1 according to the first modification may provide an overlap in image data in the sub-scanning direction Y.

Thus, a pixel group 10grc according to the first modification is less than a two-pixel pitch in a vertical direction, in which a one-pixel pitch is divided into three parts in a horizontal direction. The green pixel Gn having a shape sandwiched between the L-shaped blue pixel Bn and the L-shaped red pixel Rn obtained by rotating the blue pixel Bn by 180 degrees is disposed. The shape of the blue pixel Bn, the shape of the green pixel Gn, and the shape of the red pixel Rn are different. Pixel apertures for the pixels of all the colors in the sub-scanning direction Y according to the first modification are wider than those of the solid-state imaging device 1 according to the first embodiment, and it is possible to further increase sensitivity.

A main region AG of the green pixel Gn is disposed at a center (midpoint) of the pixel group 10grc. Therefore, when a one-pixel pitch in the sub-scanning direction Y is shorter than a length of the pixel group 10grc in the sub-scanning direction Y, an aperture of the main region AG of the green pixel Gn is also disposed within the one-pixel pitch. As a result, even when the overlap occurs in the sub-scanning direction Y, a contour of an image within the vertical one-pixel pitch and the horizontal one-pixel pitch can be easily obtained.

Second Modification

Figure 8:
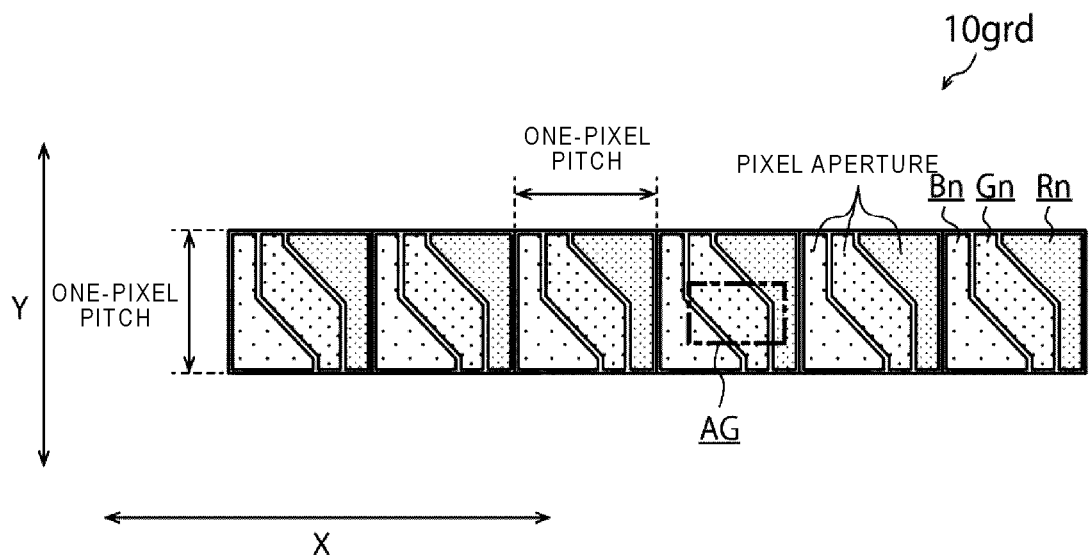
FIG. 8 is a diagram showing a configuration example of a pixel group according to a second modification.

FIG. 8 is a diagram showing a configuration example of a pixel group 10grd according to a second modification. As shown in FIG. 8, the red pixel Rn, the green pixel Gn, and the blue pixel Bn are arranged by dividing a vertical one-pixel pitch and a horizontal one-pixel pitch into three parts. More specifically, the green pixel Gn having a shape sandwiched between the blue pixel Bn and the red pixel Rn is disposed. The blue pixel Bn has a shape obtained by adding a triangle to a rectangle and the red pixel Rn has a shape obtained by rotating the shape of the blue pixel Bn by 180 degrees. The shape of the blue pixel Bn, the shape of the green pixel Gn, and the shape of the red pixel Rn are thus each different from one another. Pixel apertures for the pixels of all the colors in the main scanning direction X are wide. For examples, the pixel apertures have a spread of two-thirds of the one-pixel pitch, and thus more information on a color distribution in the main scanning direction X can be obtained. The pixel apertures in the vertical sub-scanning direction Y also have a width corresponding to the one-pixel pitch, and pixel sensitivity is higher. The green pixel Gn is disposed at a center (midpoint) of the vertical one-pixel pitch distance and the horizontal one-pixel pitch distance. That is, the main region AG of the green pixel Gn is disposed about a center of the pixel group 10grd. Accordingly, since an aperture of the green pixel Gn is widely disposed at a center of the pixel pitch, even if a mechanical shift occurs in the main scanning direction X or the sub-scanning direction Y during reading, a contour of an image within the vertical one-pixel pitch and the horizontal one-pixel pitch can be easily obtained.

Third Modification

Figure 9:
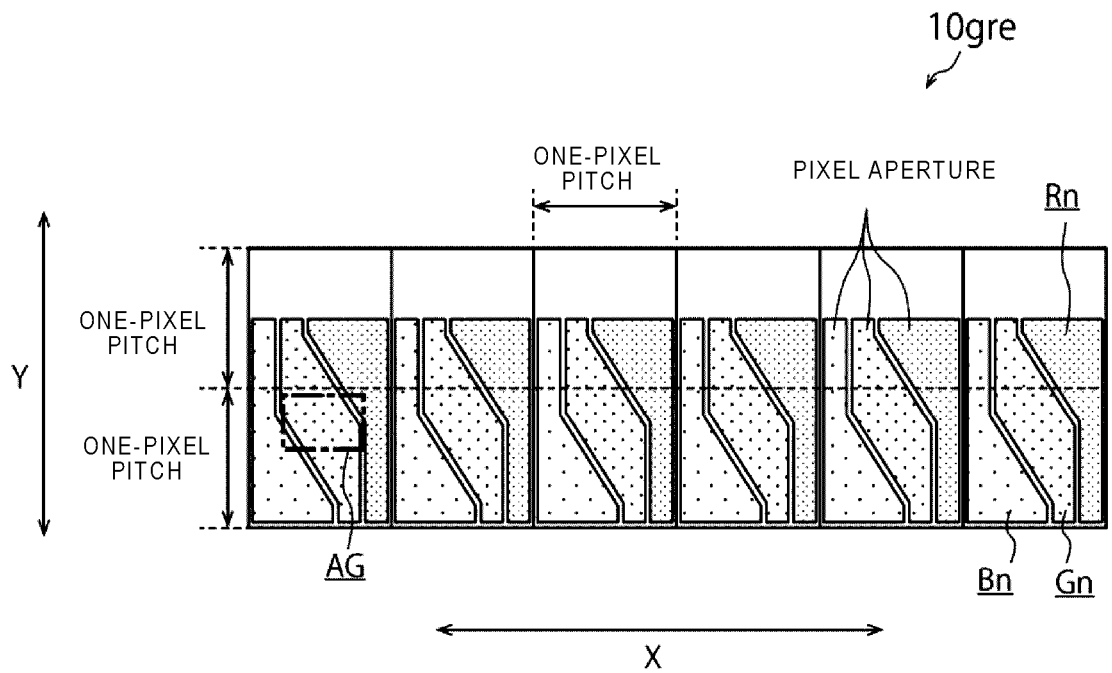
FIG. 9 is a diagram showing a configuration example of a pixel group according to a third modification.

FIG. 9 is a diagram showing a configuration example of a pixel group 10gre according to a third modification. As shown in FIG. 9, the third modification differs from the second modification in that sizes of the red pixel Rn, the green pixel Gn, and the blue pixel Bn in the sub-scanning direction Y are set to be larger than the pixel pitch distance (one-pixel pitch) but less than 2 times (2×) the pixel pitch distance. That is, the solid-state imaging device 1 according to the third modification may provide an overlap in image data in the sub-scanning direction Y.

Thus, the pixel group 10gre according to the third modification is less than a two-pixel pitch in a vertical direction, in which a one-pixel pitch is divided into three parts in a horizontal direction. More specifically, the green pixel Gn is sandwiched between the blue pixel Bn and the red pixel Rn. The blue pixel Bn has a shape obtained by adding a triangle to a rectangle and the red pixel Rn has a shape obtained by rotating the shape of the blue pixel Bn by 180 degrees. Pixel apertures for the pixels of all the colors in the sub-scanning direction Y are wider than those of the solid-state imaging device 1 according to the second modification, and it is possible to further increase sensitivity.

The main region AG of the green pixel Gn is disposed at a center (midpoint) of the pixel group 10gre. Therefore, when a one-pixel pitch distance in the sub-scanning direction Y is shorter than a length of the pixel group 10gre in the sub-scanning direction Y, an aperture of the main region AG of the green pixel Gn is also disposed within the one-pixel pitch. Accordingly, even when overlap in the sub-scanning direction Y, a contour of an image within a vertical one-pixel pitch and a horizontal one-pixel pitch can be easily obtained.

Fourth Modification

Figure 10:
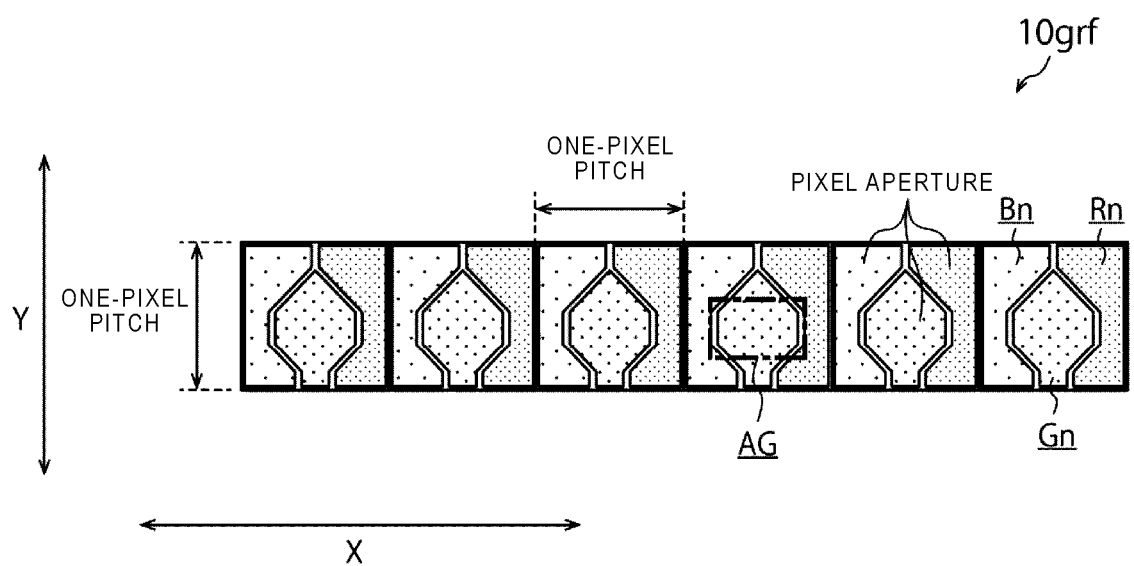
FIG. 10 is a diagram showing a configuration example of a pixel group according to a fourth modification.

FIG. 10 is a diagram showing a configuration example of a pixel group 10grf according to a fourth modification. As shown in FIG. 10, the red pixel Rn, the green pixel Gn, and the blue pixel Bn are arranged by dividing a vertical one-pixel pitch and a horizontal one-pixel pitch into three parts. More specifically, the green pixel Gn having a shape sandwiched between the blue pixel Bn and the red pixel Rn is disposed. The blue pixel Bn has a shape that may be called a "C" shape or a concave shape, and the red pixel Rn has a shape obtained by rotating the shape of the blue pixel Bn by 180 degrees (a reverse "C" shape). The shape of the blue pixel Bn, the shape of the green pixel Gn, and the shape of the red pixel Rn are thus each different from one another. Pixel apertures for the pixels of all the colors in the main scanning direction X are wide, for example, have a spread of two-thirds of the one-pixel pitch, and more information on a color distribution in the main scanning direction X can be obtained. The pixel apertures in the vertical sub-scanning direction Y also have a width corresponding to the one-pixel pitch, and pixel sensitivity is higher. The green pixel Gn is disposed at a center (midpoint) of the vertical one-pixel pitch distance and the horizontal one-pixel pitch distance. That is, a main region AG of the green pixel Gn is disposed at a center of the pixel group 10grf. Accordingly, since an aperture of the green pixel Gn is widely disposed about a center of the pixel pitch, even if a mechanical shift occurs in the main scanning direction X or the sub-scanning direction Y during reading, a contour of an image within the vertical one-pixel pitch and the horizontal one-pixel pitch can be easily obtained.

Fifth Modification

Figure 11:
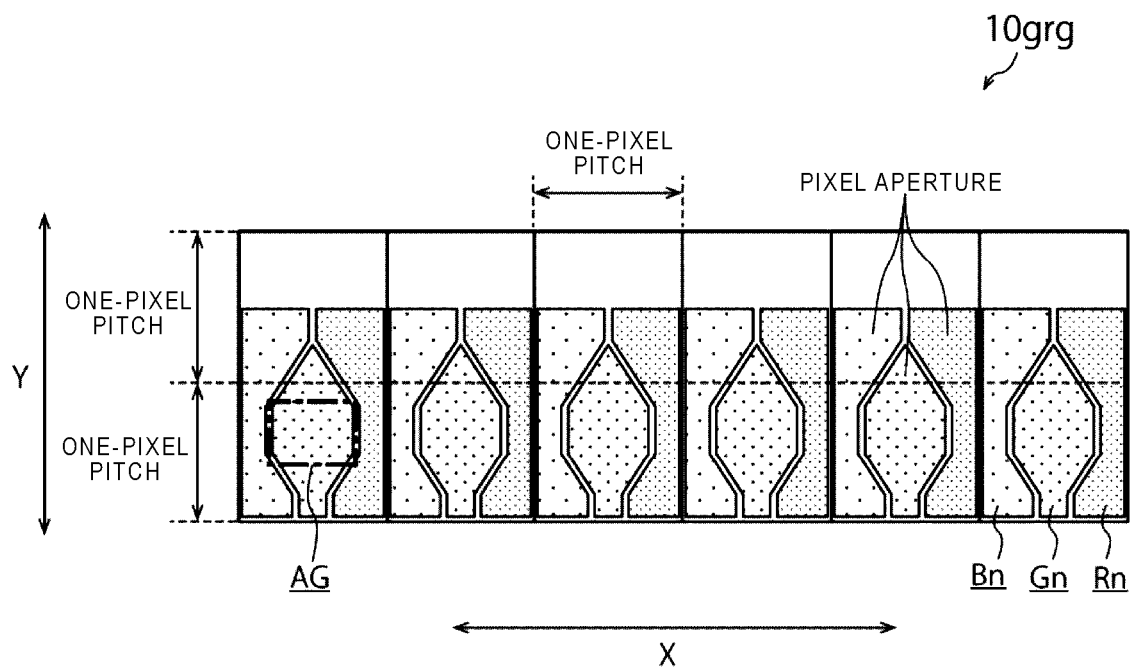
FIG. 11 is a diagram showing a configuration example of a pixel group according to a fifth modification.

FIG. 11 is a diagram showing a configuration example of a pixel group 10grg according to a fifth modification. As shown in FIG. 11, the fifth modification differs from the second modification in that sizes of the red pixel Rn, the green pixel Gn, and the blue pixel Bn in the sub-scanning direction Y are set to be larger than the pixel pitch distance but less than 2 times (2×) the pixel pitch distance. That is, the solid-state imaging device 1 according to the third modification may provide an overlap in image data in the sub-scanning direction Y.

Thus, the pixel group 10grg according to the fifth modification is less than a two-pixel pitch in a vertical direction, in which a one-pixel pitch is divided into three parts in a horizontal direction. More specifically, the green pixel Gn is sandwiched between the blue pixel Bn and the red pixel Rn. The blue pixel Bn has a "C" shape and the red pixel Rn has a shape obtained by rotating the shape of the blue pixel Bn by 180 degrees. Pixel apertures for the pixels of all the colors in the sub-scanning direction Y are wider than those of the solid-state imaging device 1 according to the fourth modification, and it is thus possible to further increase sensitivity.

The main region AG of the green pixel Gn is disposed at a center (midpoint) of the pixel group 10grg. Therefore, when a one-pixel pitch in the sub-scanning direction Y is shorter than a length of the pixel group 10grg in the sub-scanning direction Y, an aperture of the main region AG of the green pixel Gn is also disposed within the one-pixel pitch. As a result, even when the overlap occurs in the sub-scanning direction Y, a contour of an image within the vertical one-pixel pitch and the horizontal one-pixel pitch can be easily obtained.

Sixth Modification

Figure 12:
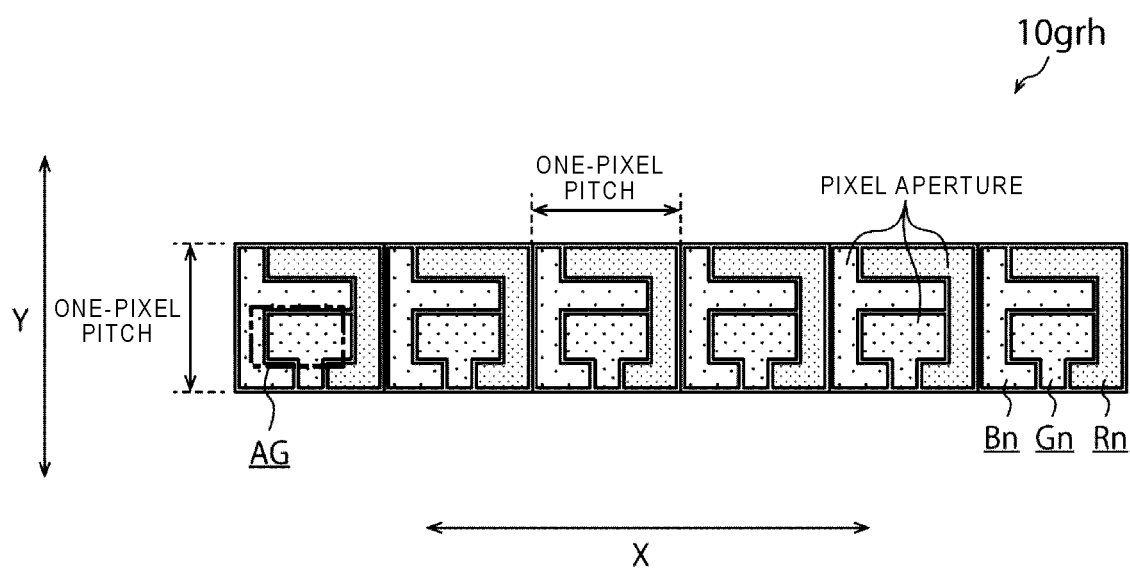
FIG. 12 is a diagram showing a configuration example of a pixel group according to a sixth modification.

FIG. 12 is a diagram showing a configuration example of a pixel group 10grh according to a sixth modification. As shown in FIG. 12, the red pixel Rn, the green pixel Gn, and the blue pixel Bn are arranged by dividing a vertical one-pixel pitch and a horizontal one-pixel pitch into three parts. More specifically, the green pixel Gn having what may be called generally a "T" shape or more a particularly a truncated "T" shape) is sandwiched between the blue pixel Bn and the red pixel Rn. The blue pixel Bn has what may be called a modified "C" shape. The modified "C" shape in this context includes an additional rectangular portion on an upper arm portion of the basic "C" shape. The upper arm portion is also longer than the lower arm portion of the "C" shape. The red pixel Rn has what may be called a reverse "C" shape, though the upper arm portion is longer than the lower arm portion. The shape of the blue pixel Bn, the shape of the green pixel Gn, and the shape of the red pixel Rn are thus different from each other. Pixel apertures for the pixels of all the colors in the main scanning direction X are wide. For example, the pixel apertures have a spread of two-thirds of the one-pixel pitch, and thus more information on a color distribution in the main scanning direction X can be obtained. The pixel apertures in the vertical sub-scanning direction Y also have a width corresponding to the one-pixel pitch, and pixel sensitivity is higher. The green pixel Gn is disposed at a center (midpoint) of the vertical one-pixel pitch and the horizontal one-pixel pitch. That is, the main region AG of the green pixel Gn is disposed at a center of the pixel group 10grh. Accordingly, since an aperture of the green pixel Gn is widely provided about a center of the pixel pitch, even if a mechanical shift occurs in the main scanning direction X or the sub-scanning direction Y during reading, a contour of an image within the vertical one-pixel pitch and the horizontal one-pixel pitch can be easily obtained.

Seventh Modification

Figure 13:
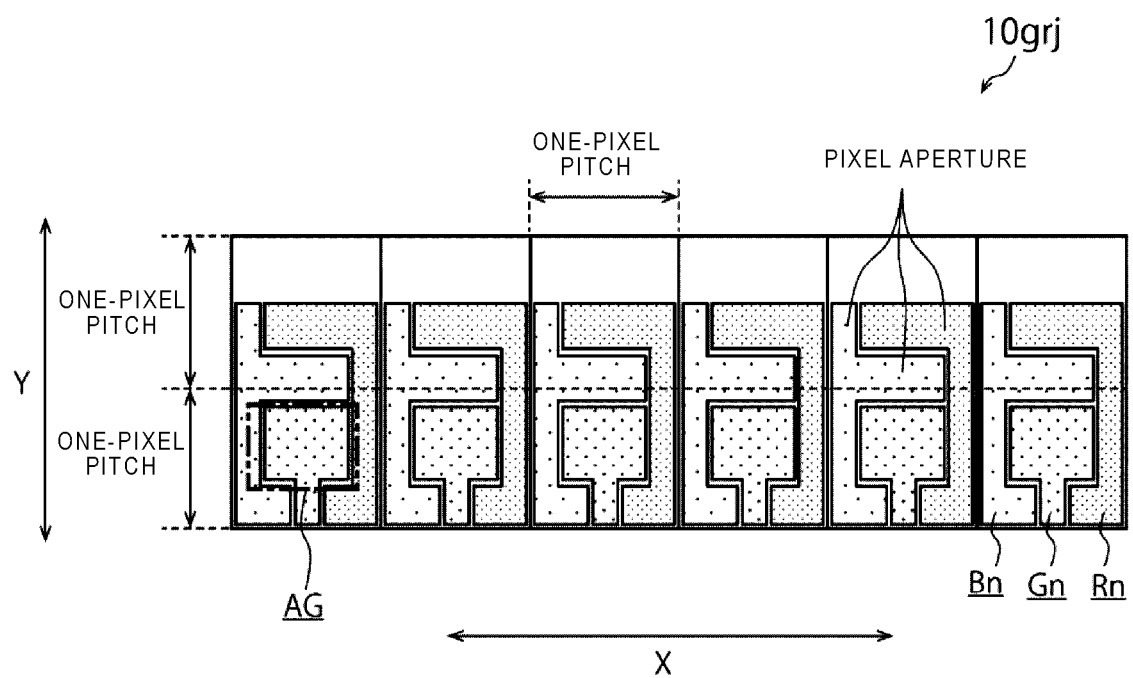
FIG. 13 is a diagram showing a configuration example of a pixel group according to a seventh modification.

FIG. 13 is a diagram showing a configuration example of a pixel group 10grj according to a seventh modification. As shown in FIG. 9, the seventh modification differs from the sixth modification in that sizes of the red pixel Rn, the green pixel Gn, and the blue pixel Bn in the sub-scanning direction Y are set to be larger than the pixel pitch distance (one-pixel pitch) but less than 2 times (2×) the pixel pitch distance. That is, the solid-state imaging device 1 according to the seventh modification may provide an overlap in image data in the sub-scanning direction Y.

Thus, the pixel group 10grj according to the seventh modification is less than a two-pixel pitch in a vertical direction, in which a one-pixel pitch is divided into three parts in a horizontal direction. More specifically, the green pixel Gn has a shape similar to the green pixel Gn in the sixth embodiment ("T" shape or truncated "T" shape), and is sandwiched between the blue pixel Bn and the red pixel Rn. The blue pixel Bn has a shape similar to the blue pixel Bn in the sixth embodiment (modified "C" shape"). The red pixel Rn has a shape similar to the red pixel Rn in the sixth embodiment (reverse "C" shape"). However, pixel apertures for the pixels of all the colors in the sub-scanning direction Y are wider than those of the solid-state imaging device 1 according to the sixth modification, and it is thus possible to further increase sensitivity.

The main region AG of the green pixel Gn is disposed at a center of the pixel group 10grj. Therefore, when a one-pixel pitch in the sub-scanning direction Y is shorter than a length of the pixel group 10grj in the sub-scanning direction Y, an aperture of the main region AG of the green pixel Gn is also disposed within the one-pixel pitch. As a result, even when the overlap occurs in the sub-scanning direction Y, a contour of an image within the vertical one-pixel pitch and the horizontal one-pixel pitch can be easily obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A solid-state imaging unit, comprising:
   a photoelectric conversion layer; and
   a control element layer below the photoelectric conversion layer in a stacking direction and including therein a charge transfer circuit, a charge voltage conversion circuit, and an output circuit, wherein
   the photoelectric conversion layer includes a plurality of pixels arranged along a first direction, wherein
   the pixels are arranged in groups each including a first type pixel, a second type pixel, and a third type pixel directly adjacent along the first direction,
   each group being a first pitch distance wide in the first direction and a second pitch distance wide in a second direction orthogonal to the first and stacking directions,
   each of the pixels includes:
      a photoelectric conversion unit, and a filter stacked on the photoelectric conversion unit in the stacking direction, the filter having a planar shape matching a planar shape of the photoelectric conversion unit, the filter of the first type pixel is a first type filter that passes a first wavelength range, the filter of the second type pixel is a second type filter that passes a second wavelength range, the filter of the third type pixel is a third type filter that passes a third wavelength range, the first wavelength range, the second wavelength range, and the third wavelength range are each different wavelength ranges, the first type filter, the second type filter, and the third type filter are each a different planar shape, a maximum width of each filter in the first direction is greater than or equal to one half the first pitch distance, and a maximum width of each filter in the second direction is greater than or equal to one half the second pitch distance.

2. The solid-state imaging unit according to claim 1, wherein a width of the first type filter in the first direction gradually changes with distance along the second direction for at least a portion of the first type filter, and a width of the third type filter in the first direction gradually changes with distance along the second direction for at least a portion of the second type filter.

3. The solid-state imaging unit according to claim 1, wherein the first pitch distance corresponds to a pixel resolution distance of the solid-state imaging unit.

4. The solid-state imaging unit according to claim 1, wherein the second type filter is sandwiched between the first and third type filters in the first direction, and the third type filter has a planar shape matching a planar shape of the first type filter rotated by 180 degrees.

5. The solid-state imaging unit according to claim 1, wherein the first type filter has a constant width in the first direction up to a predetermined point along the second direction, after which the width of the first type filter in the first direction becomes greater than the constant width.

6. The solid-state imaging unit according to claim 1, wherein the first type filter passes red light, the second type filter passes green light, and the third type filter passes blue light.

7. The solid-state imaging unit according claim 1, wherein the second type filter occupies a midpoint position of the group, and the maximum width of the first and second type filters along the second direction is equal to the second pitch distance.

8. The solid-state imaging unit according to claim 1, wherein the filters of the first pixel, the second pixel, and the third pixel in each group extend the entire second pitch distance along the sub-scanning direction from one outer edge of the group to an opposite outer edge of the group.

9. A solid-state imaging device, comprising:

a plurality of photoelectric conversion units arranged along a main scanning direction, each photoelectric conversion unit having a light filter with a planar shape corresponding to a planar shape of the photoelectric conversion unit;

a charge transfer circuit configured to read and transfer a signal charge from the plurality of photoelectric conversion units; and a charge voltage conversion circuit configured to convert the signal charge received from the charge transfer circuit into a signal voltage and output a pixel signal to an output circuit, wherein the photoelectric conversion units are arranged in groups of three in which the filter of a first unit of the group is a first type filter, a second unit of the group is a second type filter, and a third unit of the group is a third type filter, the first, second, and third type filters are each configured to pass a different specific wavelength range, the groups are adjacent to one another along the main scanning direction, each group is a first pitch distance wide in the main scanning direction and a second pitch distance wide in a sub-scanning direction perpendicular to the main scanning direction, a maximum width of each of the filters in each group in the main scanning direction is greater than or equal to one half the first pitch distance, and a maximum width of each of the filters in each group in the sub-scanning direction is greater than or equal to one half the second pitch distance.

10. The solid-state imaging device according to claim 9, wherein the photoelectric conversion units and the filters are in a photoelectric conversion layer, the charge transfer circuit and the charge voltage conversion circuit are in a control element layer, and the photoelectric conversion layer and the control element layer are stacked on each other.

11. The solid-state imaging device according to claim 9, wherein each photoelectric conversion unit is a photodiode.

12. The solid-state imaging device according to claim 9, wherein a width of the first type filter in the main scanning direction gradually changes with distance along the sub-scanning direction for at least a portion of the first type filter, and a width of the third type filter in the main scanning direction gradually changes with distance along the sub-scanning direction for at least a portion of the second type filter.

13. The solid-state imaging device according to claim 9, wherein the first pitch distance corresponds to a pixel resolution distance of the solid-state imaging device.

14. The solid-state imaging device according to claim 9, wherein the second type filter is sandwiched between the first and third type filters in the main scanning direction, and the third type filter has a planar shape matching a planar shape of the first type filter rotated by 180 degrees.

15. The solid-state imaging device according to claim 9, wherein the first type filter has a constant width in the main scanning direction up to a predetermined point along the sub-scanning direction, after which the width of the first type filter in the main scanning direction becomes greater than the constant width.

16. The solid-state imaging device according to claim 9, wherein the first type filter passes red light, the second type filter passes green light, and the third type filter passes blue light.

17. The solid-state imaging device according to claim 9, further comprising:

a control circuit configured to control an accumulation cycle of the signal charges of the plurality of photoelectric conversion units.

18. The solid-state imaging device according to claim 17, wherein the control circuit controls an accumulation cycle of the photoelectric conversion units in each group to be simultaneous with each other.

19. The solid-state imaging device according to claim 9, wherein each of the first type filter, the second type filter, and the third type filter in each group extends the entire second pitch distance along the sub-scanning direction from one outer edge of the group to an opposite outer edge of the group.

20. The solid-state imaging device according to claim 19, wherein each of the first type filter, the second type filter, and the third type filter in each group extends for less than the entire first pitch distance along the main scanning direction from one outer edge of the group to an opposite outer edge of the group.

* * * * *